United States Patent
Lin et al.

(10) Patent No.: US 9,607,963 B2
(45) Date of Patent: Mar. 28, 2017

(54) SEMICONDUCTOR DEVICE AND FABRICATION METHOD THEREOF

(71) Applicant: Siliconware Precision Industries Co., Ltd., Taichung (TW)

(72) Inventors: Chang-Fu Lin, Taichung (TW);
Chin-Tsai Yao, Taichung (TW);
Ming-Chin Chuang, Taichung (TW);
Fu-Tang Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/258,361

(22) Filed: Apr. 22, 2014

(65) Prior Publication Data

US 2015/0014848 A1     Jan. 15, 2015

(30) Foreign Application Priority Data

Jul. 10, 2013 (TW) .............. 102124670 A (51) Int. Cl.
*H01L 23/00* (2006.01)
*H01L 21/48* (2006.01)
*H01L 23/498* (2006.01)

(52) U.S. Cl.
CPC ......... *H01L 24/81* (2013.01); *H01L 21/4846* (2013.01); *H01L 23/49811* (2013.01); *H01L 24/16* (2013.01); *H01L 24/05* (2013.01); *H01L 24/13* (2013.01); *H01L 24/17* (2013.01); *H01L 2224/0401* (2013.01); *H01L 2224/131* (2013.01); *H01L 2224/13147* (2013.01); *H01L 2224/1601* (2013.01); *H01L 2224/16057* (2013.01); *H01L 2224/16225* (2013.01); *H01L 2224/16227* (2013.01); *H01L 2224/16237* (2013.01); *H01L 2224/17106* (2013.01); *H01L 2224/73204* (2013.01); *H01L 2224/81385* (2013.01); *H01L 2224/81815* (2013.01); *H01L 2924/01029* (2013.01); *H01L 2924/35121* (2013.01)

(58) Field of Classification Search
CPC ......... H01L 2224/065; H01L 2224/175; H01L 2924/01029; H01L 24/17; H01L 24/81; H01L 24/02–24/06
USPC ....................................................... 257/737
See application file for complete search history.

(56) References Cited

U.S. PATENT DOCUMENTS

| | | | | |
|---|---|---|---|---|
| 6,573,610 B1* | 6/2003 | Tsai | ............... | 257/780 |
| 2009/0325348 A1* | 12/2009 | Gerber | ............ | 438/120 |
| 2011/0074026 A1* | 3/2011 | Shim et al. | ............ | 257/737 |

* cited by examiner

*Primary Examiner* — Christine Enad
(74) *Attorney, Agent, or Firm* — Mintz Levin Cohn Ferris Glovsky and Popeo, P.C.

(57) ABSTRACT

A semiconductor device is disclosed, which includes: a substrate having a substrate body and a plurality of conductive pads formed on the substrate body, wherein each of the conductive pads has at least an opening formed in a first surface thereof; a semiconductor component having a plurality of bonding pads; a plurality of conductive elements formed between the bonding pads and the conductive pads and in the openings of the conductive pads; and an encapsulant formed between the substrate and the semiconductor component for encapsulating the conductive elements, thereby strengthening the bonding between the conductive elements and the conductive pads and consequently increasing the product yield.

12 Claims, 6 Drawing Sheets

SEMICONDUCTOR DEVICE AND FABRICATION METHOD THEREOF

CROSS-REFERENCES TO RELATED APPLICATIONS

This application claims under 35 U.S.C. §119(a) the benefit of Taiwanese Application No. 102124670, filed Jul. 10, 2013, the entire contents of which is incorporated herein by reference.

BACKGROUND OF THE INVENTION

1. Field of the Invention

The present invention relates to semiconductor devices and fabrication methods thereof, and more particularly, to a semiconductor device and a fabrication method thereof for increasing the product yield.

2. Description of Related Art

Along with the rapid development of semiconductor technologies, semiconductor devices have been developed toward the trend of small size and high yield so as to meet the miniaturization requirement of electronic products.

Figure 1A:
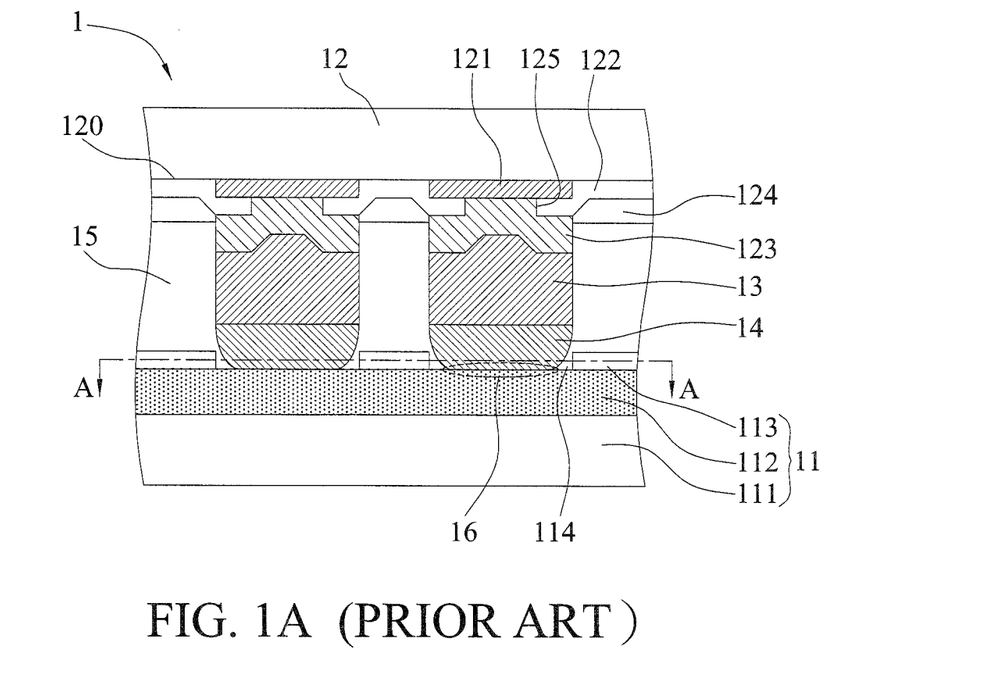
FIG. 1A is a schematic cross-sectional view of a conventional semiconductor device.
Figure 1B:
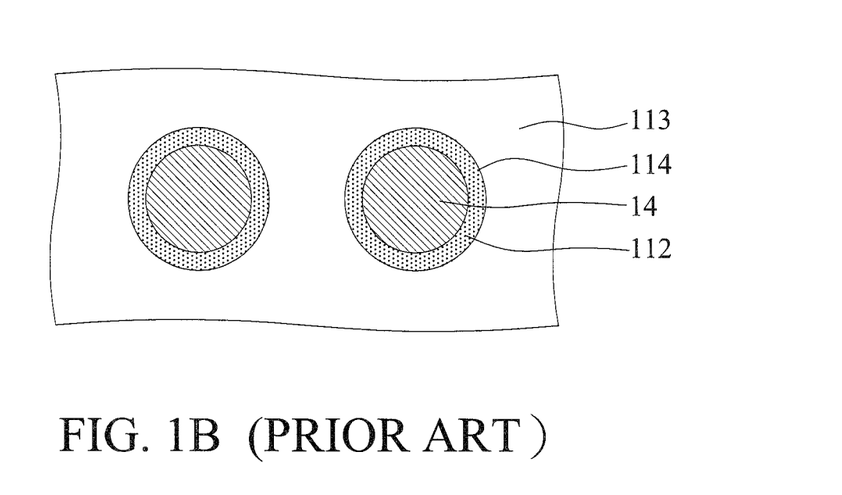
FIG. 1B is a schematic top view of the semiconductor device along a line AA of FIG. 1A.

FIG. 1A is a schematic cross-sectional view of a conventional semiconductor device. FIG. 1B is a schematic top view of the semiconductor device along a line AA of FIG. 1A. Referring to FIGS. 1A and 1B, the semiconductor device 1 has a substrate 11, a semiconductor chip 12, a plurality of conductive bumps 13 and a solder material 14 connecting the substrate 11 and the semiconductor chip 12, and an encapsulant 15 formed between the substrate 11 and the semiconductor chip 12 for encapsulating the semiconductor chip 12, the conductive bumps 13 and the solder material 14.

The substrate 11 has a substrate body 111 and a plurality of copper pads 112 and a solder mask layer 113 sequentially formed on the substrate body 111. The solder mask layer 113 has a plurality of openings 114 for exposing the copper pads 112. The semiconductor chip 12 has a plurality of bonding pads 121 and a dielectric layer 122 formed on a surface 120 thereof. A plurality of openings 125 are formed in the dielectric layer 122 for exposing the bonding pads 121 and a UBM (Under Bump Metallurgy) layer 123 is further formed on the bonding pads 121 in the openings 125 of the dielectric layer 122. Furthermore, an insulating layer 124 is formed on the dielectric layer 122.

The conductive bumps 13 are formed on the UBM layer 123, and the solder material 14 is formed between the conductive bumps 13 and the copper pads 112 in the openings 114 of the solder mask layer 113.

However, in the above-described semiconductor device 1, delamination easily occurs at interfaces 16 between the copper pads 112 and the solder material 14 due to poor bonding therebetween. As such, the product yield is reduced.

Therefore, there is a need to provide a semiconductor device and a fabrication method thereof so as to overcome the above-described drawbacks.

SUMMARY OF THE INVENTION

In view of the above-described drawbacks, the present invention provides a semiconductor device, which comprises: a substrate having a substrate body and a plurality of conductive pads formed on the substrate body, wherein each of the conductive pads has at least an opening formed in a first surface thereof; a semiconductor component having a plurality of bonding pads; a plurality of conductive elements formed between the bonding pads and the conductive pads and in the openings of the conductive pads; and an encapsulant formed between the substrate and the semiconductor component and encapsulating the conductive elements.

The present invention further provides a fabrication method of a semiconductor device, which comprises the steps of: providing a substrate having a substrate body and a plurality of conductive pads formed on the substrate body, wherein each of the conductive pads has at least an opening formed in a first surface thereof; providing a semiconductor component having a plurality of bonding pads; forming a plurality of conductive elements between the bonding pads and the conductive pads and in the openings of the conductive pads; and forming between the substrate and the semiconductor component an encapsulant that encapsulates the conductive elements.

In an embodiment, a solder mask layer is further formed on the substrate body and the conductive pads and has a plurality of openings for exposing the openings of the conductive pads.

In an embodiment, each of the conductive pads further has a second surface opposite to the first surface and the opening of the conductive pad penetrates the first and second surfaces of the conductive pad for exposing a portion of the substrate body, thus allowing the corresponding conductive element to be formed on side walls of the opening and on the exposed portion of the substrate body. The conductive pads can be copper pads.

In an embodiment, at least two bonding pads of the semiconductor component are bonded through the conductive elements to a same conductive pad of the substrate that has openings corresponding to the at least two bonding pads. In another embodiment, the bonding pads of the semiconductor component are bonded through the conductive elements to different conductive pads of the substrate that have openings corresponding to the bonding pads The openings of the conductive pads can have a rectangular shape, a circular shape, a θ shape or a Y shape.

Each of the conductive elements can have a conductive body formed on the corresponding bonding pad and a solder material formed between the conductive body and the corresponding conductive pad and in the opening of the conductive pad. The conductive body can be a conductive bump or a copper post.

According to the present invention, the conductive elements formed between the bonding pads of the semiconductor component and the conductive pads of the substrate for connecting the bonding pads and the conductive pads are further formed in the openings of the conductive pads to come into contact with the side surfaces of the openings and the exposed portions of the substrate body, thereby increasing the contact area between the conductive elements and the conductive pads as well as the substrate body and consequently strengthening the bonding between the conductive elements and the conductive pads and overcoming the conventional drawback of delamination. Further, the present invention reduces the height and volume of the semiconductor device and the use of the encapsulant. Therefore, the semiconductor device of the present invention has reduced size and cost and increased product yield.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

Figure 2A:
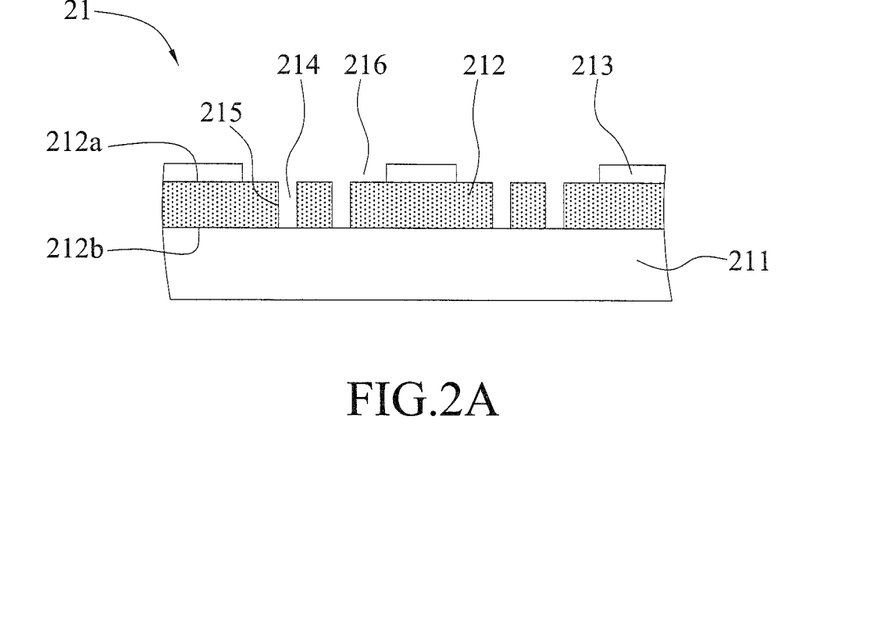
FIGS. 2A to 2C are schematic cross-sectional views showing a semiconductor device and a fabrication method thereof according to a first embodiment of the present invention, wherein FIG. 2A' is schematic top view of FIG. 2A.
Figure 2B:
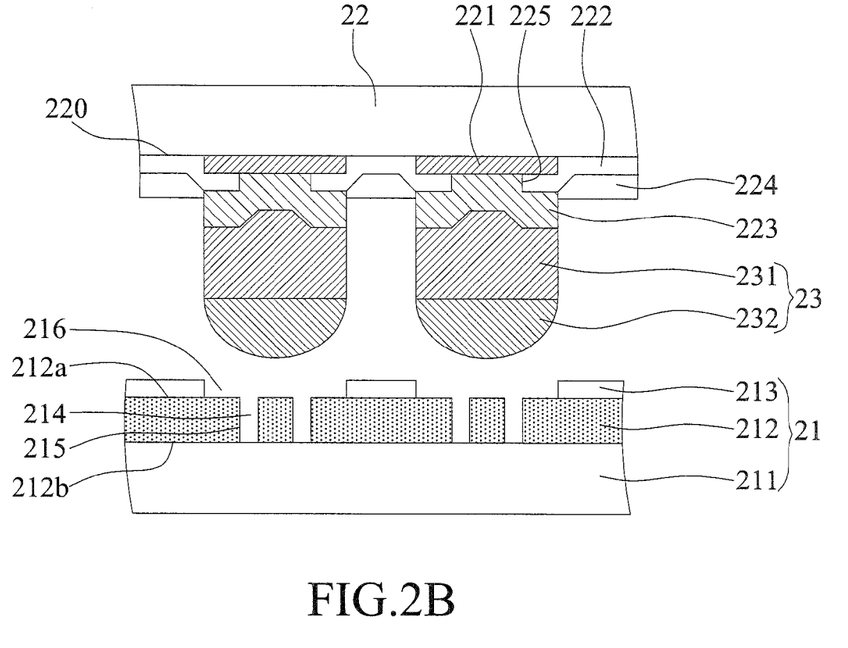
Figure 2C:
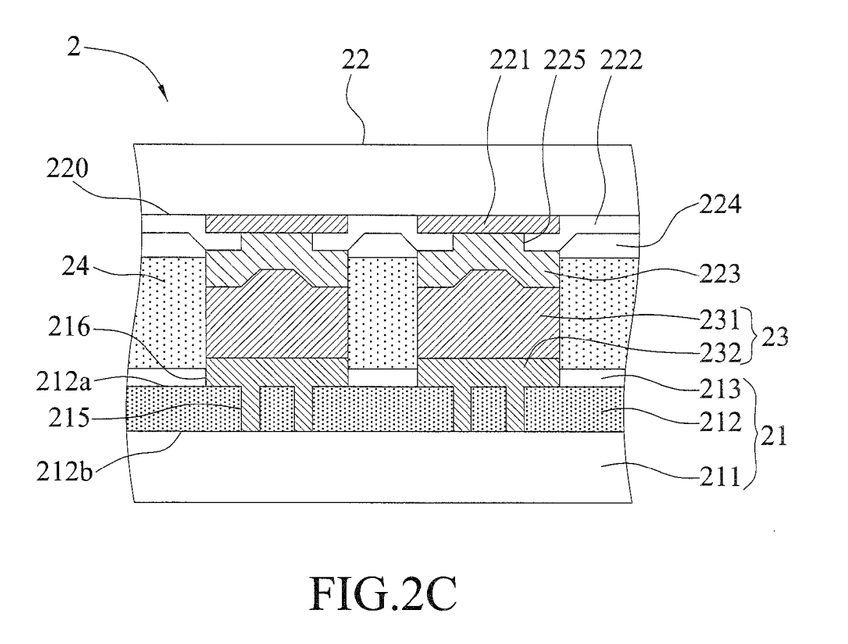

FIGS. 2A to 2C are schematic cross-sectional views showing a semiconductor device and a fabrication method thereof according to a first embodiment of the present invention. Therein, FIG. 2A' is a schematic top view of FIG. 2A.

Referring to FIGS. 2A and 2A', a substrate 21 is provided. The substrate 21 has a substrate body 211 and a plurality of conductive pads 212 formed on the substrate body 211. Each of the conductive pads 212 has a first surface 212a and a second surface 212b opposite to the first surface 212a and at least an opening 214 formed in the first surface 212a.

In an embodiment, each of the conductive pads 212 can have two rectangular-shaped openings 214 formed therein. In another embodiment, each of the conductive pads 212 can have a single rectangular-shaped opening 214 formed therein. In other embodiments, the opening 214 can have a circular shape, a θ shape, a Y shape and so on. The conductive pads 212 can be copper pads.

Further, a solder mask layer 213 is formed on the substrate body 211 and the conductive pads 212 and has a plurality of openings 216 for exposing the openings 214 of the conductive pads 212.

The openings 214 penetrate the first surfaces 212a and the second surfaces 212b of the conductive pads 212 so as to expose portions of the substrate body 211 and side surfaces of the conductive pads 212. In another embodiment, the openings 214 do not penetrate the second surfaces 212b of the conductive pads 212 and hence do not expose the substrate body 211.

Referring to FIG. 2B, a semiconductor component 22 is provided, which has a plurality of bonding pads 221 formed on a surface 220 thereof. The semiconductor component 22 can be a semiconductor chip or a semiconductor package.

Then, a plurality of conductive elements 23 are formed on the bonding pads 221 of the semiconductor component 22 corresponding to the openings 214 of the conductive pads 212.

In an embodiment, a dielectric layer 222 is formed on the surface 220 of the semiconductor component 22 and the bonding pads 221 and has a plurality of openings 225 for exposing the bonding pads 221, an UBM layer 223 is formed on the bonding pads 221 in the openings 225 of the dielectric layer 222, and an insulating layer 224 is formed on the dielectric layer 222. As such, the conductive elements 23 are formed on the UBM layer 223.

Referring to FIG. 2C, the conductive elements 23 are disposed on the first surfaces 212a of the conductive pads 212 exposed from the solder mask layer 213 and in the openings 214 of the conductive pads 212. Then, a reflow process is performed to cause the conductive elements 23 to flow into and fill the openings 214 of the conductive pads 212. As such, the conductive elements 23 are formed between the bonding pads 221 (or the UBM layer 223) and the first surfaces 212a of the conductive pads 212, in the openings 214 and on the side walls 215 of the openings 214 and on the exposed portions of the substrate body 211.

Thereafter, an encapsulant 24 is formed between the solder mask layer 213 of the substrate 21 and the insulating layer 224 of the semiconductor component 22 for encapsulating the conductive element 23.

In an embodiment, at least two bonding pads 221 of the semiconductor component 22 are bonded through the conductive elements 23 to a same conductive pad 212 of the substrate 21, as shown in FIGS. 2A to 2C. In another embodiment, the bonding pads 221 of the semiconductor component 22 can be bonded through the conductive elements 23 to different conductive pads 212 of the substrate 21.

Each of the conductive elements 23 has a conductive body 231 formed on the corresponding bonding pad 221 or the UBM layer 223, and a solder material 232 formed between the conductive body 231 and the first surface 212a of the corresponding conductive pad 212, in the opening 214 of the conductive pad 212 and on the sidewalls 215 of the opening 214 and on the exposed portion of the substrate body 211. The conductive body 231 can be a conductive bump or a copper post.

Referring to FIG. 2C, the present invention further provides a semiconductor device 2. The semiconductor device 2 has: a substrate 21, a semiconductor component 22, a plurality of conductive elements 23 connecting the semiconductor component 22 and the substrate 21, and an encapsulant 24 encapsulating the conductive elements 23.

The substrate 21 has a substrate body 211 and a plurality of conductive pads 212 formed on the substrate body 211. Each of the conductive pads 212 has a first surface 212a and a second surface 212b opposite to the first surface 212a and at least an opening 214 formed in the first surface 212a. The opening 214 can penetrate the first surface 212a and the second surface 212b of the conductive pad 212 to expose a portion of the substrate body 211. The conductive pad 212 can be a copper pad.

Further, a solder mask layer 213 can be formed on the substrate 21 and have a plurality of openings 216 for exposing the openings 214 of the conductive pads 212. The openings 214 can have a rectangular shape, a θ shape, a Y shape and so on. In an embodiment, each of the conductive pads 212 has two rectangular-shaped openings 214 formed therein.

The semiconductor component 22 has a plurality of bonding pads 221 formed on a surface 220 thereof. Further, a dielectric layer 222 can be formed on the surface 220 and the bonding pads 221 and has a plurality of openings 225 for exposing the bonding pads 221. Furthermore, a UBM layer 223 can be formed on the bonding pads 221 in the openings 225 of the dielectric layer 222, and an insulating layer 224 can be formed on the dielectric layer 222. The semiconductor component 22 can be a semiconductor chip or a semiconductor package.

In an embodiment, at least two bonding pads 221 of the semiconductor component 22 are bonded through the conductive elements 23 to a same conductive pad 212 of the substrate 21. In another embodiment, the bonding pads 221 of the semiconductor component 22 can be bonded through the conductive elements 23 to different conductive pads 212 of the substrate 21.

The conductive elements 23 are formed between the bonding pads 221 (or the UBM layer 223) and the first surfaces 212a of the conductive pads 212, in the openings 214 of the conductive pads 212 and on the side walls 215 of the openings 214 and on the substrate body 211.

Each of the conductive elements 23 can have a conductive body 231 formed on the corresponding bonding pad 221 or the UBM layer 223 and a solder material 232 formed between the conductive body 231 and the corresponding conductive pad 212 and in the opening 214 of the conductive pad 212. The conductive body 231 can be a conductive bump or a copper post.

The encapsulant 24 is formed between the substrate 21 and the semiconductor component 22 for encapsulating the substrate 21, the semiconductor component 22 and the conductive elements 23.

Figure 3A:
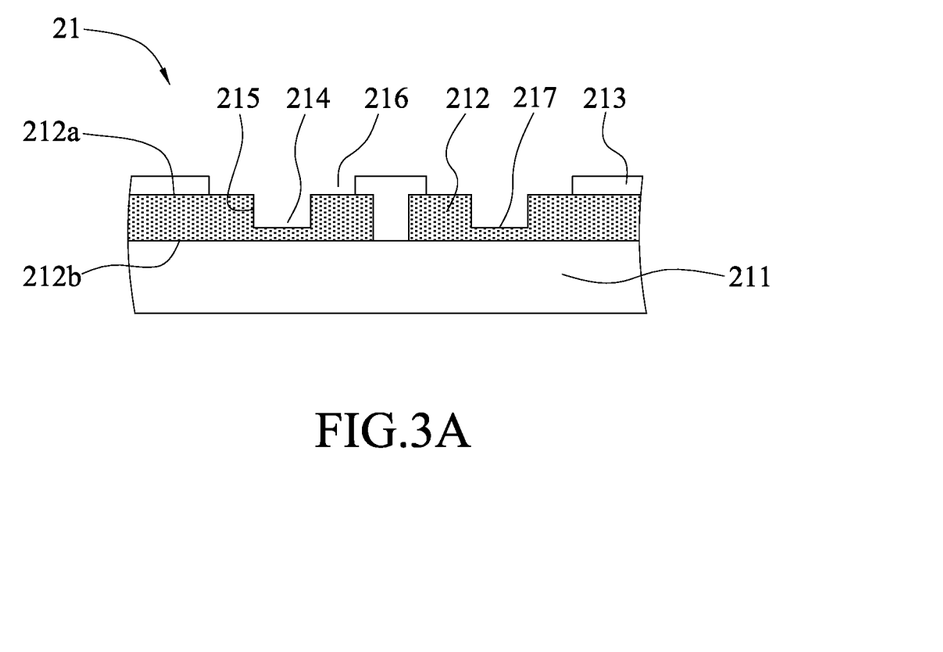
FIGS. 3A to 3C are schematic cross-sectional views showing a semiconductor device and a fabrication method thereof according to a second embodiment of the present invention, wherein FIG. 3A' is schematic top view of FIG. 3A.
Figure 3B:
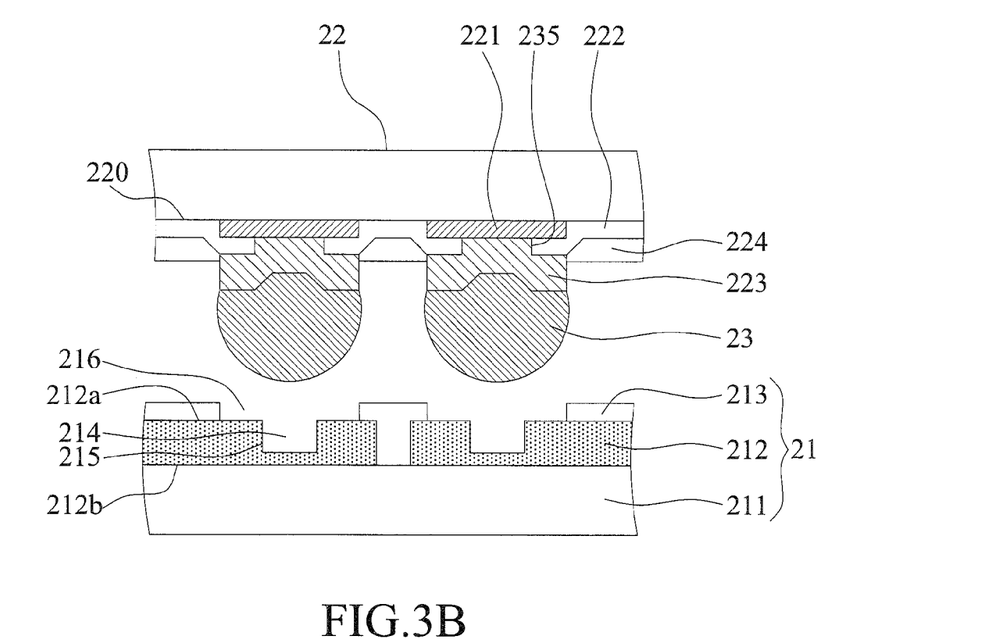
Figure 3C:
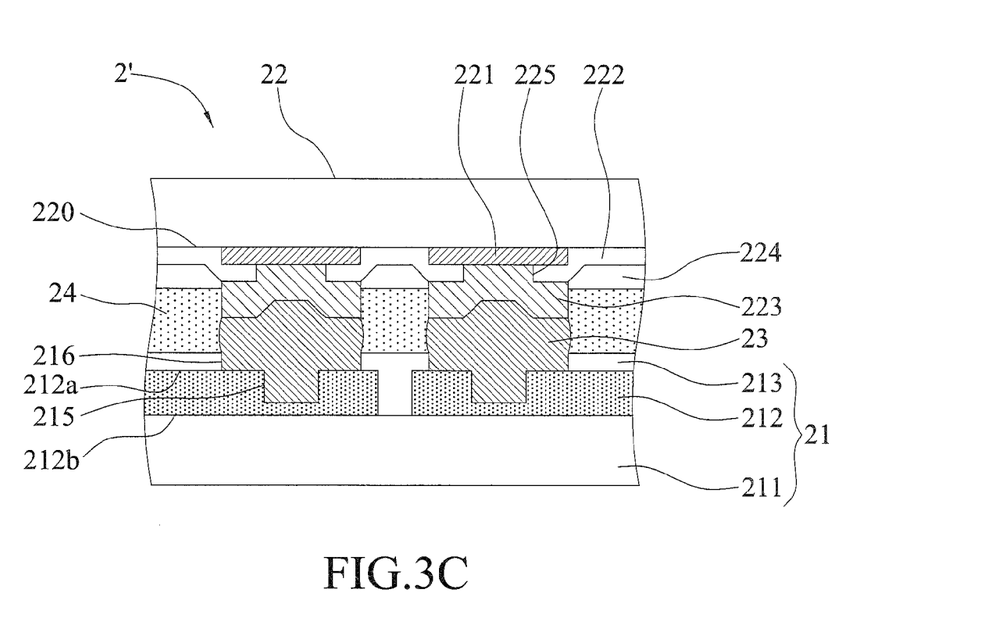

FIGS. 3A to 3C are schematic cross-sectional views showing a semiconductor device and a fabrication method thereof according to a second embodiment of the present invention. Therein, FIG. 3A' is a schematic top view of FIG. 3A. The difference of the present embodiment from the first embodiment is described as follows.

Referring to FIGS. 3A and 3A', the substrate 21 has a plurality of conductive pads 212 and each of the conductive pads 212 of the substrate 21 has a circular-shaped opening 214 that does not penetrate the second surface 212b of the conductive pad 212. As such, a bottom portion 217 of the opening 214 is exposed.

Referring to FIG. 3B, the semiconductor component 22 has a plurality of bonding pads 221 corresponding to the conductive pads 212, respectively. Each of the bonding pads 221 has a conductive element 23 formed thereon.

Referring to FIG. 3C, the bonding pads 221 are bonded to the respective conductive pads 212 through the conductive elements 23.

Referring to FIG. 3C, the present invention provides another semiconductor device 2'. The semiconductor device 2' differs from the semiconductor device 2 of the first embodiment in that the openings 214 have a circular shape and do not penetrate the second surfaces 212b of the conductive pads 212 and therefore do not expose the substrate body 211, and the bonding pads 221 of the semiconductor component 22 are bonded through the conductive elements 23 to different conductive pads 212 of the substrate 21 instead of to a same conductive pad 212 as shown in FIGS. 2A to 2C.

Figure 4A:
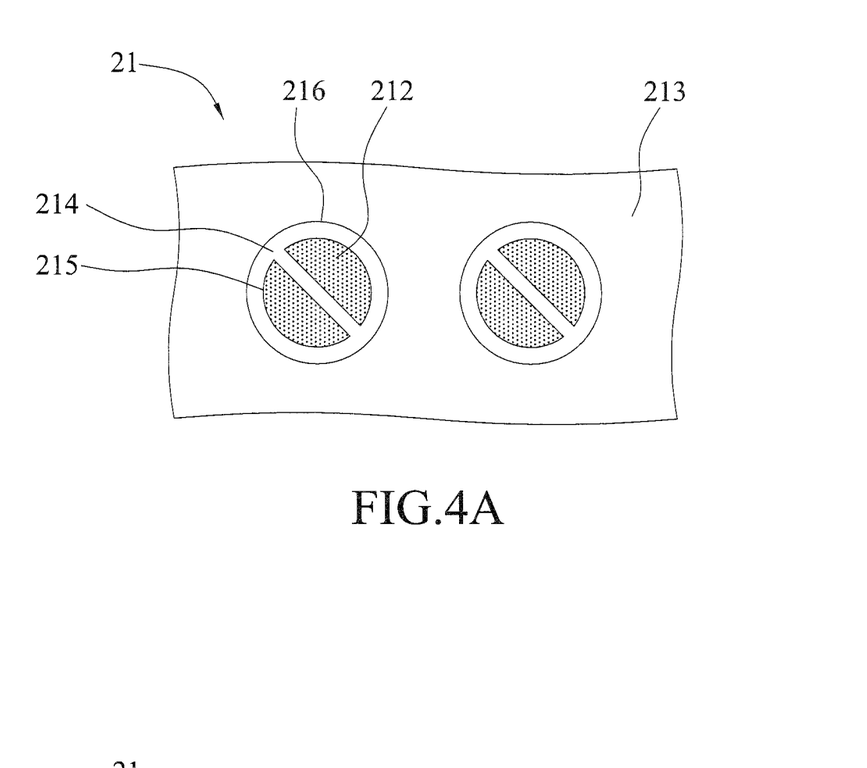
FIGS. 4A and 4B are schematic top views showing various embodiments of the conductive pads of the substrate according to the present invention.
Figure 4B:
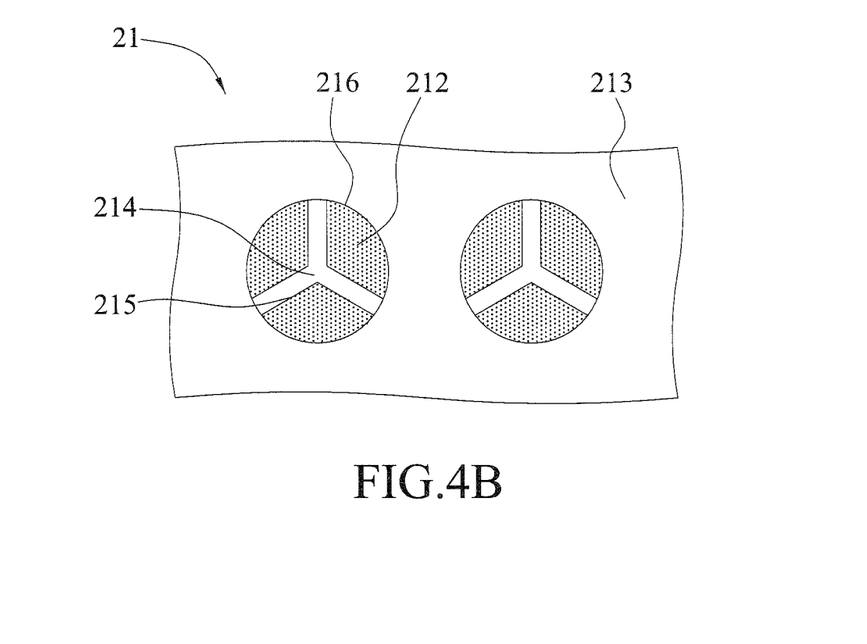

FIGS. 4A and 4B are schematic top views showing various embodiments of the conductive pads of the substrate according to the present invention.

Referring to FIG. 4A, the openings 216 can have a θ shape. Referring to FIG. 4B, the openings 216 can have a Y shape. But it should be noted that the openings are not limited to the above-described shapes.

According to the present invention, the conductive elements formed between the bonding pads of the semiconductor component and the conductive pads of the substrate for connecting the bonding pads and the conductive pads are further formed in the openings of the conductive pads to come into contact with the side surfaces of the openings and the exposed portions of the substrate body, thereby increasing the contact area between the conductive elements and the conductive pads as well as the substrate body and consequently strengthening the bonding between the conductive elements and the conductive pads and overcoming the conventional drawback of delamination. Further, the present invention reduces the height and volume of the semiconductor device and the use of the encapsulant. Therefore, the semiconductor device according to the present invention has reduced size and cost and increased product yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor device, comprising:
   a substrate having a substrate body, a plurality of conductive pads formed on the substrate body, and a solder mask layer formed on the substrate body, wherein one of the conductive pads has two openings formed in a first surface thereof, and the solder mask layer exposes the two openings of the one of the conductive pads;
   a semiconductor component having a plurality of bonding pads;
   a plurality of conductive elements formed between the bonding pads and the conductive pads so as to electrically connect the semiconductor component to the substrate via the conductive elements, wherein the one of the conductive pads is bonded through the two openings to two of the conductive elements; and
   an encapsulant formed between the substrate and the semiconductor component and encapsulating the conductive elements.

2. The semiconductor device of claim 1, wherein the one of the conductive pads further has a second surface opposite to the first surface, and the two openings of the one of the conductive pads penetrate the first and second surfaces for exposing a portion of the substrate body, thus allowing the two of the conductive elements to be formed on side walls of the two openings and on the exposed portion of the substrate body.

3. The semiconductor device of claim 1, wherein the conductive pads are copper pads.

4. The semiconductor device of claim 1, wherein each of the two openings has a rectangular shape, a circular shape, a θ shape or a Y shape.

5. The semiconductor device of claim 1, wherein each of the conductive elements has a conductive body formed on the corresponding bonding pad and a solder material formed between the conductive body and the corresponding conductive pad.

6. The semiconductor device of claim 5, wherein the conductive body is a conductive bump or a copper post.

7. A fabrication method of a semiconductor device, comprising the steps of:
   providing a substrate having a substrate body, a plurality of conductive pads formed on the substrate body, and a solder mask layer formed on the substrate body, wherein one of the conductive pads has two openings formed in a first surface thereof, and the solder mask layer exposes the two openings of the one of the conductive pads;

providing a semiconductor component having a plurality of bonding pads;

forming a plurality of conductive elements between the bonding pads and the conductive pads, wherein the one of the conductive pads is bonded through the two openings to two of the conductive elements; and forming between the substrate and the semiconductor component an encapsulant that encapsulates the conductive elements.

8. The fabrication method of claim 7, wherein the one of the conductive pads further has a second surface opposite to the first surface, and the two openings of the one of the conductive pads penetrate the first and second surfaces for exposing a portion of the substrate body, thus allowing the two of the conductive elements to be formed on side walls of the two openings and on the exposed portion of the substrate body.

9. The fabrication method of claim 7, wherein the conductive pads are copper pads.

10. The fabrication method of claim 7, wherein each of the two openings has a rectangular shape, a circular shape, a θ shape or a Y shape.

11. The fabrication method of claim 7, wherein each of the conductive elements has a conductive body formed on the corresponding bonding pad and a solder material formed between the conductive body and the corresponding conductive pad.

12. The fabrication method of claim 11, wherein the conductive body is a conductive bump or a copper post.

* * * * *